United States Patent
Raj et al.

(10) Patent No.: US 11,322,200 B1
(45) Date of Patent: May 3, 2022

(54) SINGLE-RAIL MEMORY CIRCUIT WITH ROW-SPECIFIC VOLTAGE SUPPLY LINES AND BOOST CIRCUITS

(71) Applicant: GLOBALFOUNDRIES U.S. Inc., Malta, NY (US)

(72) Inventors: Vivek Raj, Bangalore (IN); Shivraj G. Dharne, Bangalore (IN); Uttam K. Saha, San Jose, CA (US); Mahbub Rashed, Cupertino, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/120,325

(22) Filed: Dec. 14, 2020

(51) Int. Cl.
*G11C 11/419* (2006.01)
*G11C 11/418* (2006.01)
*G11C 11/412* (2006.01)

(52) U.S. Cl.
CPC .......... *G11C 11/419* (2013.01); *G11C 11/412* (2013.01); *G11C 11/418* (2013.01)

(58) Field of Classification Search
CPC ..... G11C 11/41; G11C 11/412; G11C 11/413; G11C 11/417; G11C 11/418; G11C 11/419
USPC ........................................................ 365/154
See application file for complete search history.

(56) References Cited

U.S. PATENT DOCUMENTS

| | | | |
|---|---|---|---|
| 6,430,087 B1 | 8/2002 | Bill et al. | |
| 7,636,254 B2 | 12/2009 | Ehrenreich et al. | |
| 8,427,896 B1 | 4/2013 | Agarwal et al. | |
| 8,488,396 B2 | 7/2013 | Lee et al. | |
| 8,659,972 B2 | 2/2014 | Phan et al. | |
| 9,330,751 B2 | 5/2016 | Nagle et al. | |
| 9,548,104 B1 | 1/2017 | Braceras et al. | |
| 2016/0247559 A1* | 8/2016 | Atallah | H01L 27/1104 |
| 2016/0329094 A1* | 11/2016 | Luan | G11C 11/39 |
| 2020/0051603 A1 | 2/2020 | Kitagawa et al. | |

OTHER PUBLICATIONS

Carslon et al., "Compensation of Systematic Variations Through Optimal Biasing of SRAM Wordlines", IEEE Custom Integrated Circuits Conference (CICC), 2008, pp. 411-414.

Chen et al., "A Dense 45nm Half-differential SRAM with Lower Minimum Operating Voltage", IEEE International Symposium of Circuits and Systems (ISCAS), 2011, pp. 1-4.

(Continued)

*Primary Examiner* — Alfredo Bermudez Lozada
(74) *Attorney, Agent, or Firm* — Gibb & Riley, LLC; David A. Cain, Esq.

(57) ABSTRACT

A single-rail memory circuit includes an array of memory cells arranged in rows and columns and peripheral circuitry connected to the array for facilitating read and write operations with respect to selected memory cells. The peripheral circuitry includes, but is not limited to, boost circuits for the rows. Each boost circuit is connected to a wordline for a row and to a discrete voltage supply line for the same row. Each boost circuit for a row is configured to increase the voltage levels on the wordline and the voltage supply line for the row during a read of any selected memory cell within the row. Increasing the voltage levels on the wordline and on the voltage supply line during the read operation effectively boosts the read current. A method of operating the memory circuit reduces the probability of a read fail.

20 Claims, 9 Drawing Sheets

(56) References Cited

OTHER PUBLICATIONS

Chuang et al., "High-Performance SRAM in Nanoscale CMOS: Design Challenges and Techniques", IEEE, 2007, pp. 4-12.
Moradi et al., "Multi-Level Wordline Driver for Low Power SRAMs in Nano-Scale CMOS Technology", IEEE, 2011, pp. 326-331.
Moradi et al., "Multi-Level Wordline Driver for Robust SRAM Design in Nano-Scale CMOS Technology", Microelectronics Journal, vol. 45, 2014, pp. 23-34.
Sachid et al., "Denser and More Stable FinFET SRAM using Miltiple Fin Heights", IEEE Transactions on Electron Devices, vol. 59, No. 8, 2012, pp. 2037-2041.
Singh et al., "Read and Write Stability of 6T SRAM", International Journal of Advanced Research in Electronics and Communication Engineering (IJARECE), vol. 3, Issue 5, 2014, pp. 569-571.

\* cited by examiner

SINGLE-RAIL MEMORY CIRCUIT WITH ROW-SPECIFIC VOLTAGE SUPPLY LINES AND BOOST CIRCUITS

BACKGROUND

Field of the Invention

The present invention relates to memory circuits and, more particularly, to embodiments of a single-rail memory circuit and operating method.

Description of Related Art

Memory circuits typically include an array of memory cells arranged in rows and columns and peripheral circuitry, which is connected to the array and which facilitates various functions (e.g., read and write functions) in the memory cells. Historically, memory circuits were single-rail memory circuits. That is, the same positive supply voltage (e.g., VDD) would be employed for powering the entire memory circuit including the memory cells and the peripheral circuitry. Unfortunately, as cell size is scaled (e.g., by reducing transistors size) to reduce area consumption and VDD is lowered to reduce power consumption, memory cells in single-rail memory circuits have become more susceptible to read fails and, particularly, to sense fails and to read stability fails (also referred to herein as static noise margin (SNM) fails).

For example, FIG. 1A is a schematic diagram illustrating an exemplary static random access memory (SRAM) circuit 100. This SRAM circuit 100 includes an array of six transistor (6T) SRAM cells 101 arranged in rows (see rows a-n) and columns (see columns A-N). The SRAM circuit 100 also includes a controller 195 and peripheral circuitry 191-193, which is connected to the array, in communication with the controller 195, and configured to facilitate various memory functions (e.g., read operations and write operations) in response to control signals from the controller 195. FIG. 1B is a schematic diagram illustrating a 6T-SRAM cell 101 in greater detail. The 6T-SRAM cell 101 includes: a first inverter, which includes a first pull-up transistor 102 and a first pull-down transistor 103 connected in series between a positive supply voltage rail 121 and ground; and a second inverter, which is cross-coupled to the first inverter and which includes a second pull-up transistor 112 and a second pull-down transistor transistors 113 connected in series between the positive supply voltage rail 121 and ground. This 6T-SRAM cell also includes: a first access transistor 104 (also referred to herein as a first pass-gate transistor), which is connected in series between a true bitline (BLT) 131 for the column containing the cell and a data storage node 105 at a junction between the first pull-up transistor 102 and the first pull-down transistor 103 and which has a gate connected to a wordline 140 for the row containing the SRAM cell; and a second access transistor 114 (also referred to herein as a second pass-gate transistor), which is connected in series between a complement bitline (BLC) 132 for the column containing the cell and a complement data storage node 115 at a junction between the second pull-up transistor 112 and the second pull-down transistor 113 and which has a gate connected to the wordline 140 for the row.

Historically, SRAM circuits were single-rail memory circuits. However, with each new technology node, both cell size and VDD have been reduced and, as a result, the cells have become more susceptible to read fails including both read sense fails and read stability fails (i.e., SNM fails). FIGS. 2 and 3 are graphs illustrating these two different fail mechanisms, respectively.

Specifically, FIG. 2 illustrates a read sense fail. Referring to FIG. 2 in combination with FIGS. 1A-1B, if an SRAM cell stores a data value of "0" on the first data storage node 105 and a complement data value of "1" on the second data storage node 115 and a read operation is initiated (e.g., by activating the WL 140 for the row following pre-charging of the BLs 131-132 for the column), a read current (Iread) will flow from the pre-charged BLT 131 through the first access transistor 104 toward the data storage node 105 and, as a result, the voltage level on BLT 131 will drop while the voltage level on BLC 132 remains the same (i.e., at VDD). Ideally, the drop in voltage on BLT 131 will be detectable by a sense circuit so that the stored data value is read out as "0". However, if the drop in voltage on the BLT 131 is relatively small (e.g., see the differential 201), it may not be detectable by the sense circuit and the stored data value will be read as a "1". This read fail mechanism is referred to herein as a sense fail.

FIG. 3 illustrates a read stability fail. Referring to FIG. 3 in combination with FIGS. 1A-1B, if an SRAM cell stores a data value of "0" on the first data storage node 105 and a complement data value of "1" on the second data storage node 115 and a read operation is initiated (e.g., by activating the WL 140 for the row following pre-charging the BLs 131-132 for the column, Iread will flow from the pre-charged BLT 131 through the first access transistor 104 toward the data storage node 105 and, as a result, the voltage level on BLT 131 will drop while the voltage level on BLC 132 remains the same. Ideally, as Iread flows toward the data storage node 105, the first pull-down transistor 103 will continuously pull-down the voltage level on that data storage node 105 to ground. However, if the drive current of the first pull-down transistor 103 is insufficient, the voltage level on the first data storage node 105 will increase. If the voltage level on the first data storage node 105 increases above the threshold voltage (Vt) of the second pull-down transistor 113, the stored data values on the nodes 105 and 115 can switch. This read fail mechanism is referred to herein as a read stability fail (or a read SNM fail).

SUMMARY

Disclosed herein embodiments of single-rail memory circuit, which is configured to avoid read fails (e.g., sense fails and/or SNM fails). The memory circuit can include an array of memory cells, which are arranged in rows and columns. The memory circuit can further include wordlines for the rows, voltage supply lines for the rows, and boost circuits for the rows. Each wordline for each row can be connected to all of the memory cells in the row. Each voltage supply line for each row can be connected to all of the memory cells in the row. Each boost circuit for each row can be incorporated into a row decoder and can be connected to the wordline for the row and to the voltage supply line for the row. Each boost circuit for each row can be configured to concurrently increase the voltage levels on both the wordline and the voltage supply line for the row during a memory function directed to any selected memory cell within the same row. For example, each boost circuit for each row can be configured to perform synchronized and concurrent increasing of the voltage levels on both the wordline and the voltage supply line for the row during a read operation directed to any selected memory cell within the row. Concurrently increasing the voltage levels on the wordline and on the voltage supply line for the row during a read operation directed to a selected memory cell within the row can effectively boost (i.e., increase) the read current, thereby reducing the probability of a read fail.

Also disclosed herein are method embodiments associated operating the above-described memory circuit. Specifically, the method can include providing a memory circuit. The memory circuit can include an array of memory cells, which are arranged in rows and columns. The memory circuit can further include wordlines for the rows, voltage supply lines for the rows, and boost circuits for the rows. Each wordline for each row can be connected to all of the memory cells in the row. Each voltage supply line for each row can be connected to all of the memory cells in the row. Each boost circuit for each row can be incorporated into a row decoder and can be connected to both the wordline for the row and to the voltage supply line for the row. The method can further include concurrently increasing, by a boost circuit for a row, the voltage levels on both the wordline and the voltage supply line for the row during a memory function direct to any selected memory cell within the row. For example, synchronized and concurrent increasing of the voltage levels on both the wordline and the voltage supply line for a row can be performed by the boost circuit for the row specifically during a read operation directed to a selected memory cell within the row. Increasing the voltage levels on the wordline and on the voltage supply line for the row during the read operation can effectively boost (i.e., increase) the read current and, thereby reduce the probability of a read fail.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Exemplary SRAM circuit configurations designed to avoid the above-described read fail mechanisms include multi-port SRAM circuits, which incorporate additional transistors into the SRAM cells (e.g., eight or ten transistors as opposed to six transistors) to create discrete read-ports, and/or dual-rail SRAM circuits, which power the SRAM cells themselves using a relatively high positive supply voltage (referred to as the cell supply voltage (VCS)) from one positive supply voltage rail and which power the peripheral circuitry, including pre-charging of the BLs and activating the WLs, using a relatively low positive supply voltage (VDD) from a different positive voltage rail (not shown). Unfortunately, such solutions can result in a significant increase in area consumption and/or a significant increase in power consumption.

In view of the foregoing, disclosed herein are embodiments of a more robust single-rail memory circuit, which is configured to avoid read fails (e.g., read sense fails and/or read stability fails) even when memory cell size is scaled to reduce area consumption and/or when the positive supply voltage (VDD) on a single positive voltage rail is lowered to reduce power consumption. Specifically, the memory circuit can include an array of memory cells (e.g., static random access memory (SRAM) cells, such as six-transistor (6T) SRAM cells) arranged in rows and columns, and peripheral circuitry connected to the array for facilitating memory functions (e.g., read operations and write operations). Peripheral circuitry for the rows can include a row decoder with boost circuits for each of the rows. Each boost circuit for each row can be connected to a wordline and to a discrete voltage supply line for the row and can be configured to concurrently increase the voltage levels on both the wordline and the voltage supply line for the row during a memory function in any selected cell within the same row. For example, each boost circuit for a row can be a read current (Tread) boost circuit configured to concurrently increase the voltage levels on the wordline and the voltage supply line for the row during a read operation directed to any selected memory cell within the row in order to effectively boost Iread and, thereby reduce the probability of a read fail. Such a memory circuit configuration provides essentially the same benefits for read operations as a dual-rail memory circuit without the need to have two positive supply voltage rails always set at two different positive voltage levels (e.g., at VDD and at VCS, which is greater than VDD) for powering the peripheral circuitry and the memory cells, respectively. Thus, it is a low leakage, low dynamic power solution. Also disclosed herein are method embodiments associated with operation of such a memory circuit.

Figure 4A:
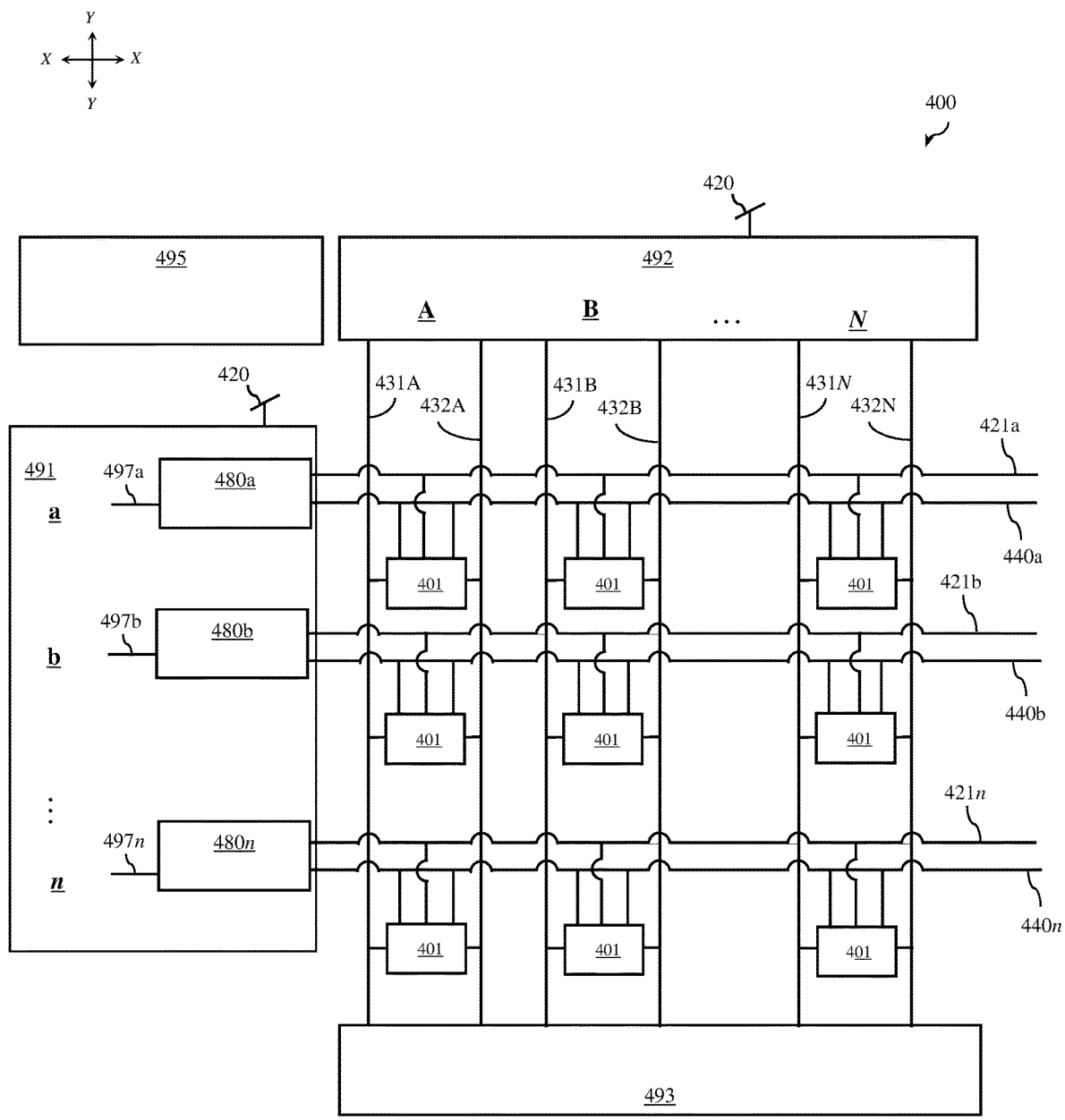
FIG. 4A is a schematic diagram illustrating a disclosed SRAM circuit.

More particularly, disclosed herein are embodiments of a memory circuit 400, as illustrated in the schematic diagram of FIG. 4A.

The memory circuit 400 can include an array of memory cells 401 arranged in rows (see rows a-n) and columns (see columns A-N). That is, the memory cells 401 within the array can be arranged in lines with first lines being essentially parallel and oriented in a first direction (e.g., the X-direction), with second lines being essentially parallel and oriented in second direction (e.g., the Y-direction) that is perpendicular to the first direction, and with each memory cell located in one first line and one second line (i.e., at the intersection between a row of the memory cells and a column of the memory cells). For purposes of illustration, the memory circuit 400 shown in FIG. 4A includes three rows of memory cells oriented in the X-direction and three columns of memory cells oriented in the Y-direction. However, it should be understood that FIG. 4A is not intended to be limiting. Alternatively, the array could include any number of rows of memory cells and any number of columns of memory cells. Furthermore, the rows could be oriented in the Y-direction and the columns could be oriented in the X-direction.

The memory cells 401 can be any suitable type of memory cell where: (a) each memory cell in the array is connected to and powered by a voltage supply; (b) a read operation directed to a memory cell in the array requires wordline activation; and (c) increasing the voltage levels of both an activated wordline and the voltage supply during the read operation would be beneficial (e.g., would boost read current (Tread) and, thereby minimize or prevent read fails). In some embodiments, the memory cells 401 can be static random access memory (SRAM) cells, such as six-transistor (6T) SRAM cells (as described in greater detail below and illustrated in the schematic diagram of FIG. 4B).

The memory circuit 400 can further include row-specific wordlines (WLs) (e.g., see WL 440a for row a, WL 440b for row b, and so on until WL 440n of row n). Each one of the WLs 440a-440n for each one of the rows a-n can be connected to all of the memory cells 401 in their corresponding row a-n.

Figure 1A:
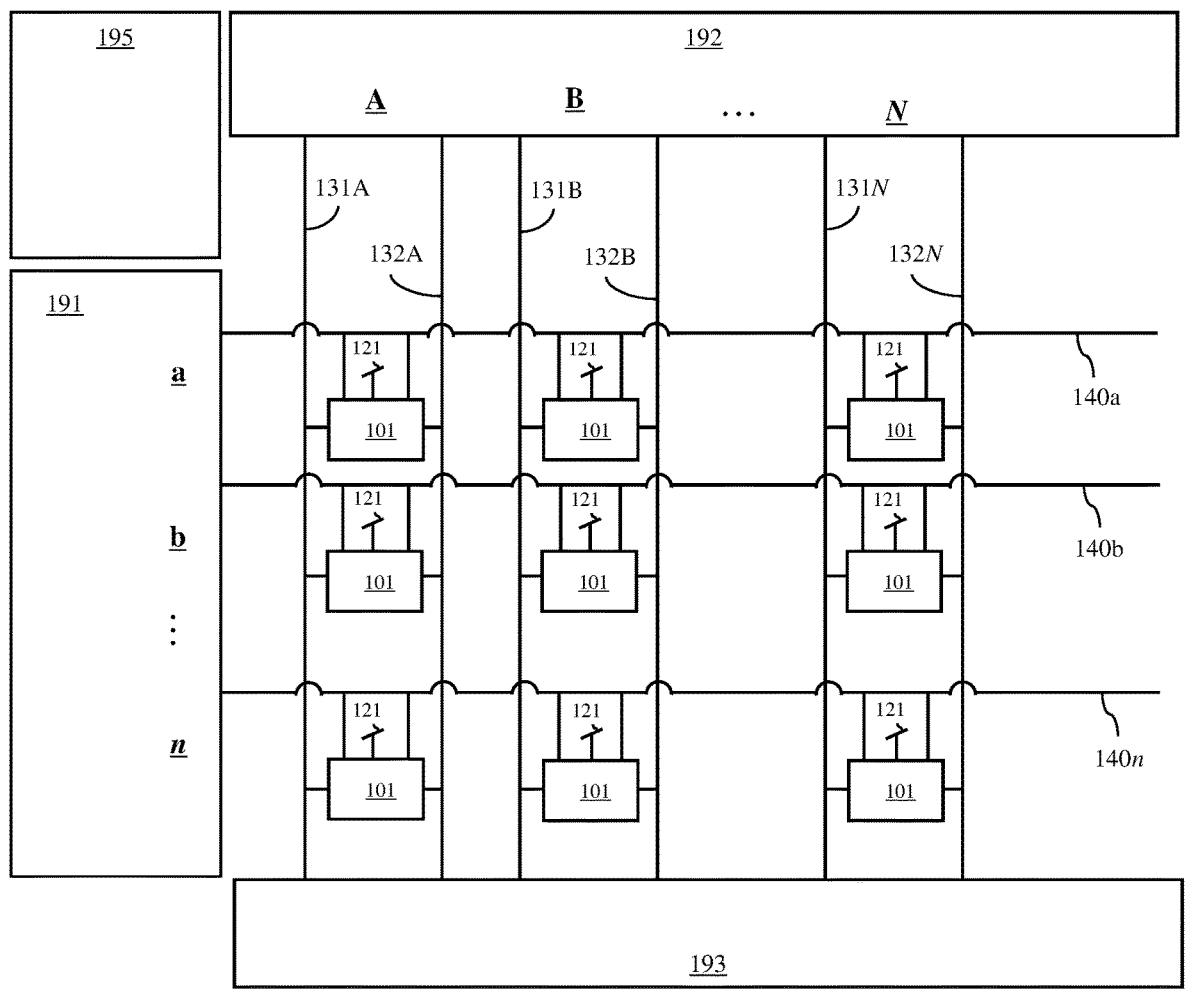
FIG. 1A is a schematic diagram illustrating a conventional static random access memory (SRAM) circuit.
Figure 1B:
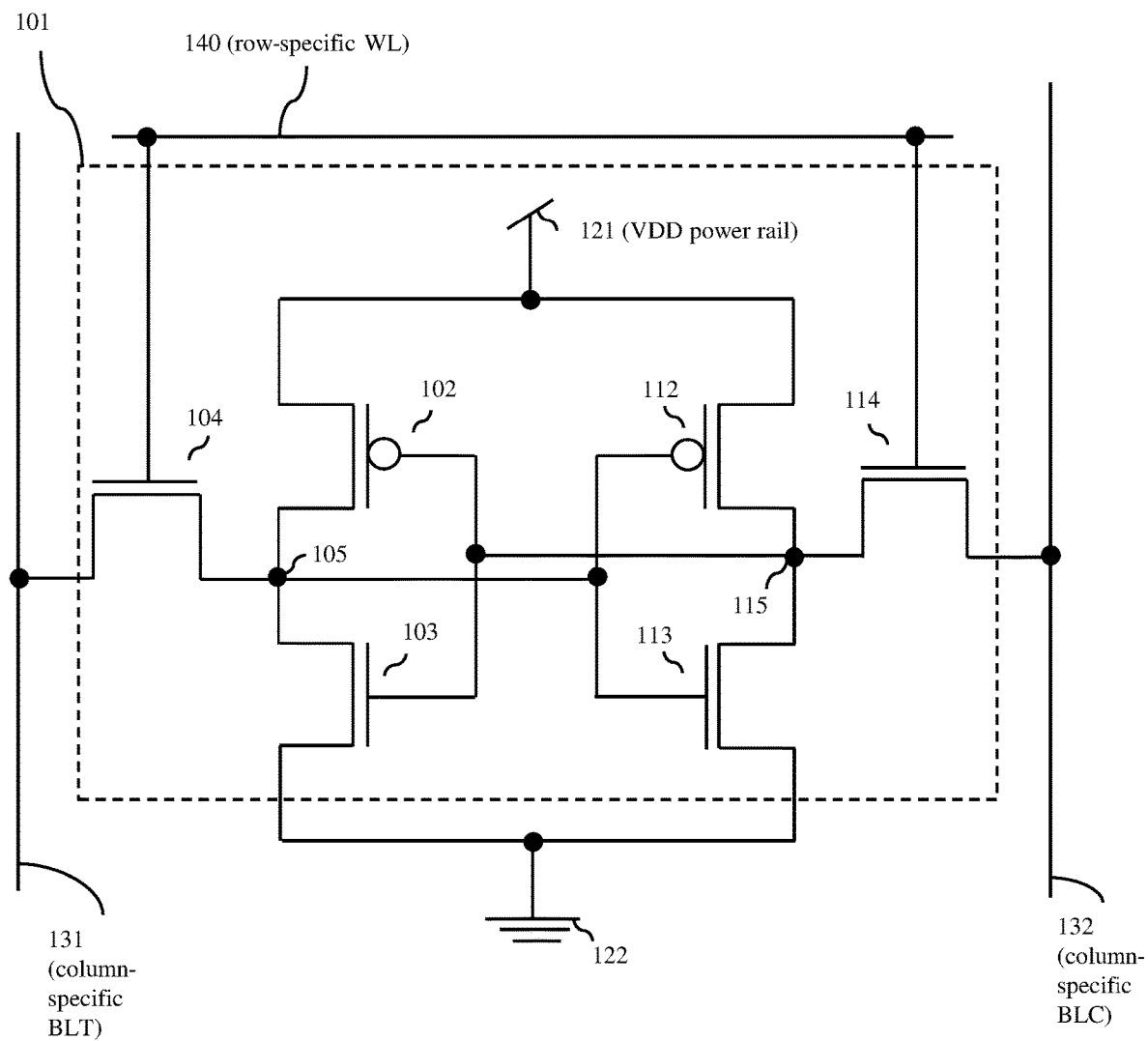
FIG. 1B is a schematic diagram illustrating an SRAM cell that can be incorporated into the SRAM circuit of FIG. 1A.

The memory circuit 400 can further include row-specific voltage supply lines (VSLs) (e.g., see VSL 421a for row a, VSL 421b for row b and so on until VSL 421n of row n). Each one of the VSLs 421a-421n for each one of the rows a-n can be connected to all of the memory cells 401 in their corresponding row a-n. It should be noted that the row-specific VSLs are separate from each other so that the voltage level on any one VSL in the memory circuit is independent of the voltage level on any other VSL in the memory circuit. Thus, each VSL, which is connected to all the memory cells 401 in a specific row (and none of the memory cells in any other row) can concurrently power all the memory cells 401 within that specific row with using the positive supply voltage. However, by employing separate VSLs for each row, the level of the positive supply voltage on any one VSL can (depending upon elements incorporated into the peripheral circuitry for the rows) be selectively adjusted so that it is different (e.g., higher or lower) than the level of the positive supply voltage on the other VSLs. For example, depending upon elements incorporated into the peripheral circuitry for the rows, selective adjustment of the level of the positive supply voltage on a VSL can be employed during a memory function (e.g., a read operation or a write operation) directed to any selected memory cell within the row in order to improve performance, reduce fails, etc. Thus, the disclosed memory circuit configuration is different from the memory circuit configuration illustrated in FIGS. 1A-1B and discussed above because, instead of using a single positive supply voltage rail 121 to concurrently power all the memory cells in the array at the same positive supply voltage level, row-specific VSLs are used.

The memory circuit 400 can further include any additional row-specific or column-specific lines required to facilitate read and/or write functions. It should be understood that the need for additional row-specific and/or column-specific lines will depend upon the type of memory cell employed in the array.

Figure 4B:
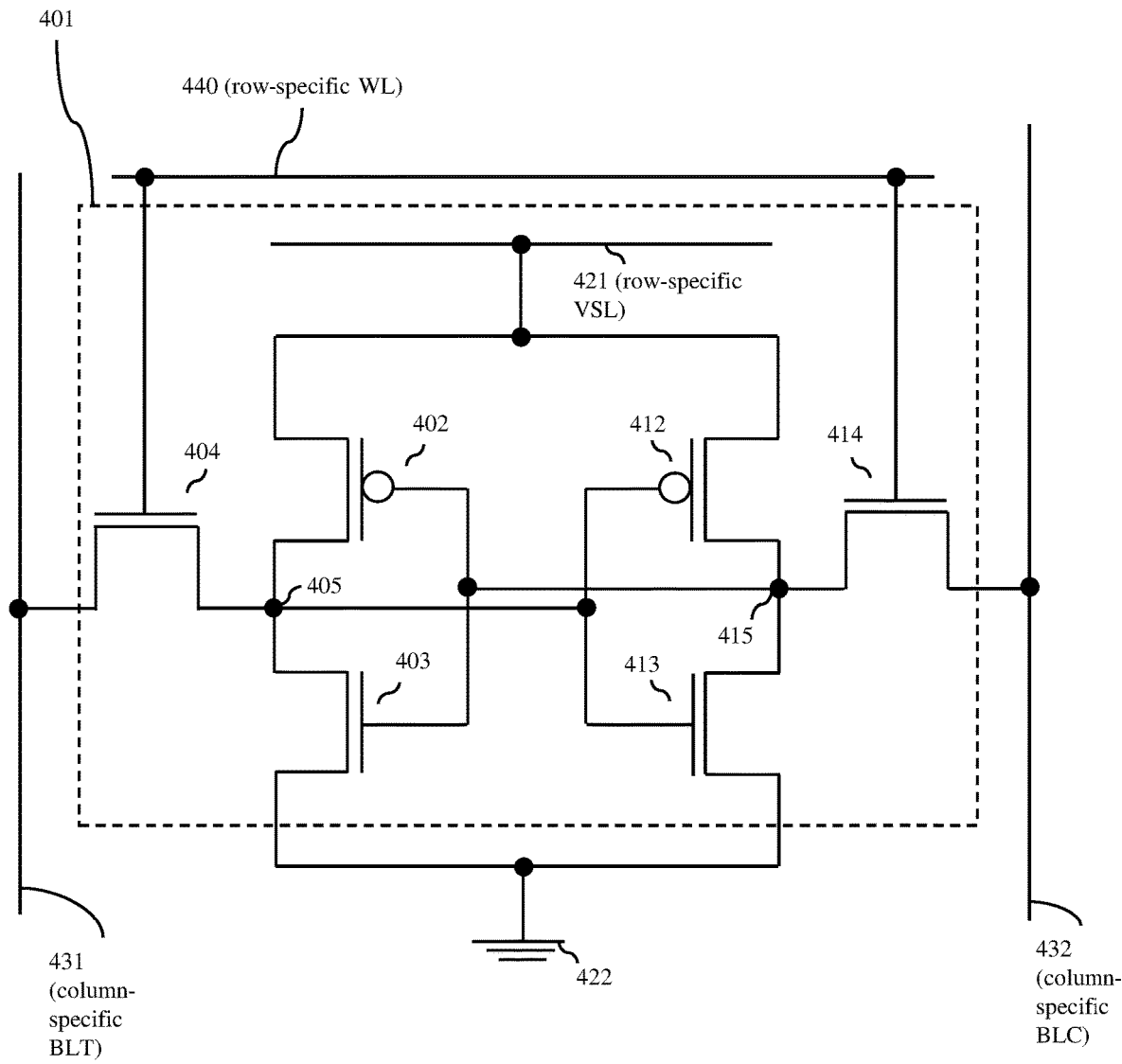
FIG. 4B is a schematic diagram illustrating an SRAM cell that can be incorporated into the SRAM circuit of FIG. 4A.

For example, as mentioned above, the memory cells 401 can be 6T-SRAM cells, as shown in FIG. 4B. In this case, the memory circuit 400 can further include column-specific true and complement bitline pairs (BLT/BLC pairs) (e.g., see BLT 431A and BLC 432A for column A, BLT 431B and BLC 432B for column B, and so on until BLT 431N and BLC 432N for column N. Each bitline of each true and complement bitline pair can be connected to all of the memory cells 401 in their corresponding column A-N.

Each 6T-SRAM cell can include a first inverter, which includes a first pull-up transistor 402 (e.g., a p-type field effect transistor (PFET)) and a first pull-down transistor 403 (e.g., an n-type field effect transistor (NFET)) connected in series between a row-specific voltage supply line (VSL) 421 and a ground rail 422. As discussed above, the VSL 421 is row-specific, is connected to and powers only the memory cells in a specific row and is not connected to all of memory cells within the array.

Each 6T-SRAM cell can further include a second inverter, which is cross-coupled to the first inverter and which includes a second pull-up transistor 412 (e.g., a PFET) and a second pull-down transistor 413 (e.g., an NFET) connected in series between the VSL 421 and the ground rail 422. Those skilled in the art will recognize that, with the cross-coupled first and second inverters, the junction (also referred to herein as the first data storage node 405 or true node) between the first pull-up transistor 402 and the first pull-down transistor 403 will be connected to (i.e., will control) the gates of the second pull-up transistor 412 and the second pull-down transistor 413. Furthermore, the junction (also referred to herein as the second data storage node 415 or complement node) between the second pull-up transistor 412 and the second pull-down transistor 413 will be connected to (i.e., will control) the gates of the first pull-up transistor 402 and the first pull-down transistor 403.

Each 6T-SRAM cell 401 can further include: a first access transistor 404 (also referred to herein as a first pass-gate transistor) (e.g., an NFET), which is connected in series between column-specific true bitline (BLT) 431 (i.e., a BLT for the column containing the SRAM cell) and the first data storage node 405 and which has a gate connected to a row-specific WL 440 (i.e., a WL for the row containing the SRAM cell); and a second access transistor 414 (also referred to herein as a second pass-gate transistor), which is connected in series between a column-specific complement bitline (BLC) 432 (i.e., a BLC for the column containing the SRAM cell) and the second data storage node 415 and which also has a gate connected to the same row-specific WL 440.

The memory circuit 400 can further include a controller 495 and peripheral circuitry, which is connected to the array, which is powered by a single positive voltage rail 420 set at a first positive supply voltage level (e.g., at a relative low VDD), which is in communication with the controller 495, and which is configured to facilitate various memory functions (e.g., read operations and write functions) in response to control signals from the controller 495. As with conventional memory circuits (e.g., conventional SRAM circuits), the peripheral circuitry can include peripheral circuitry 491 for the rows. The peripheral circuitry 491 for the rows can be connected to the WLs 440a-440n for the rows a-n and can include, for example, a row decoder configured to facilitate WL activation in order to provide memory cell access during memory functions (e.g., read operations or write operations). The peripheral circuitry can also include peripheral circuitry 492 for the columns. The peripheral circuitry 492 for the columns can be connected to the BLs for the columns A-N and can include a column decoder configured to facilitate BL biasing during the memory functions. Finally, the peripheral circuitry can include additional peripheral circuitry 493, which is also electrically connected to the BLs for the columns A-N and which includes a sense circuit configured to enable changes in BL electrical properties (e.g., voltage or current) to be sensed during read operations in order to determine stored data values within selected memory cells.

Generally, such peripheral circuitry is known in the art; however, as mentioned above, the memory circuit 400 disclosed herein includes the novel row-specific VSLs 421a-421n for concurrently powering the memory cells in each row as opposed to a single positive supply voltage rail that concurrently powers all of the memory cells in the memory array. Thus, in the memory circuit 400 disclosed herein the peripheral circuitry 491 for the rows is connected to both the WLs 440a-440n and the VSLs 421a-421n and includes novel features (e.g., within the row decoder), which are not found in the peripheral circuitry for the rows in conventional memory circuits. Specifically, in the disclosed memory circuit embodiments, the row decoder of the peripheral circuitry 491 can include row-specific boost circuits 480a-480n. Each boost circuit 480a-480n for each row a-n can be connected to a positive supply voltage rail 420 and to both the WL 440a-440n and the VSL 421a-421n for the same row. Additionally, each boost circuit 480a-480n for each row can be configured to concurrently and temporarily increase the positive supply voltage levels on both the WL for the row (after it has been activated) and the VSL for the row from the first positive supply voltage level (e.g., from VDD) to a second positive supply voltage level (e.g., to VDD+) that is greater than the first positive voltage level. This concurrent and temporary increase in the voltage levels on the WL and the VSL for a row can be synchronized and performed during a memory function directed to any selected memory cell within the row to improve performance, reduce fails, etc.

For example, each row-specific boost circuit 480a-480n in the row decoder of the peripheral circuitry 491 for the rows can be a row-specific read current (Iread) boost circuit. Each row-specific Iread boost circuit can be connected to the positive supply voltage rail 420, which as mentioned above is set at a first positive supply voltage level (e.g., at a relatively low VDD to reduce power consumption). Those skilled in the art will recognize that the actual level of this first positive supply voltage level can vary depending upon the technology node. For example, at the 22 nm fully-depleted silicon-on-insulator (FD-SOI) technology node or other similar technology nodes, the first positive supply voltage level could be set at approximately 0.45V. Each Iread boost circuit 480a-480n for each row a-n can be configured to activate the WL for its respective row (i.e., to increase the voltage level on the WL for the row from ground to the first positive supply voltage level) at the initiation of a read operation in any selected memory cell within that row. Each Iread boost circuit 480a-480n for each row can also be configured to concurrently and temporarily increase the voltage levels on both the WL for the row and the VSL for the row during the read operation. This increase in the voltage levels on WL and VSL can, for example, be from the same first positive supply voltage level (e.g., from VDD) to the same second positive supply voltage level (e.g., VDD+) that is greater than the first positive supply voltage level during the read operation. Specifically, each Iread boost circuit 480a-480n can be configured so that the voltage levels on both the WL and the VSL for the row are increased automatically and in a synchronized manner after the WL for the row has been fully activated (i.e., once the voltage level on the WL for the row has reached the first positive supply voltage level) after the initiation of the read operation. Those skilled in the art will recognize that the amount(s) by which the voltage levels on the WL and VSL for the row are increased during the read operation and the resulting voltage levels on the WL and the VSL will be customized depending upon the technology node at issue in order to ensure that the above-described read fail issues, which are associated with conventional single-rail memory circuits, are minimized or avoided all together. For example, at the 22 nm fully-depleted silicon-on-insulator (FD-SOI) technology node or other similar technology nodes, each Iread boost circuit 480a-480n can be configured so that the voltage levels on the WL and the VSL are both concurrently increased by approximately 100 mV (e.g., from an approximately 0.45V first positive supply voltage level to an approximately 0.55V second positive supply voltage level). As discussed in greater detail below, concurrently increasing the voltage levels on both the WL and the VSL for the row during a read operation of any selected memory cell within the row will effectively boost (i.e., increase) Iread through the selected memory cell and, thereby reduces the probability of a read fail and, particularly, reduce the probability of either a read sense fail or a read stability fail (i.e., a read SNM fail). Finally, each Iread boost circuit 480a-480n can further be configured to drop the voltage level on the WL for the row back down to ground and to drop the voltage level on the VSL for the row back down to the first positive supply voltage level at the completion of the read operation.

Figure 4C:
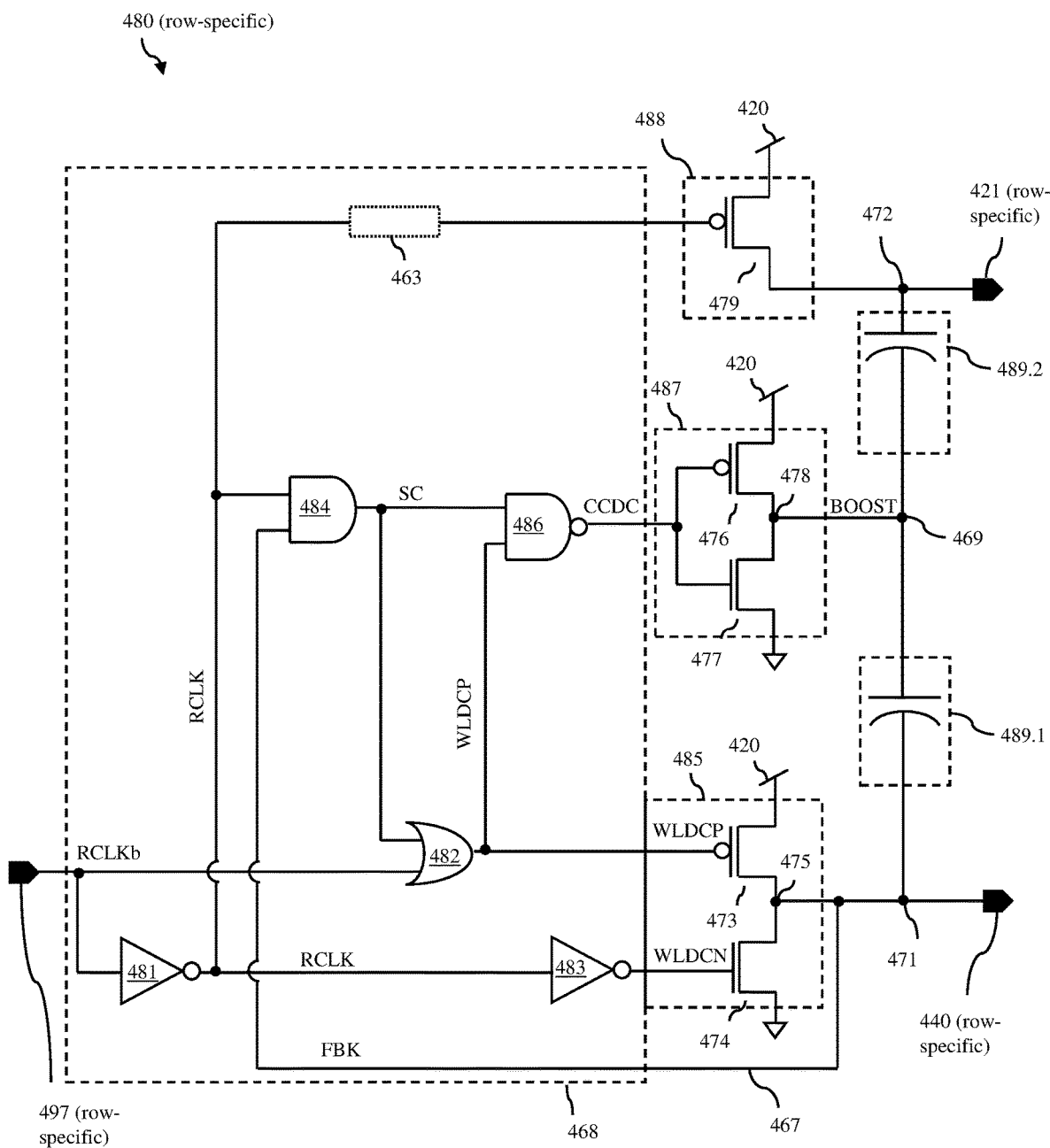
FIG. 4C is a schematic diagram illustrating a row-specific boost circuit that can be incorporated into the SRAM circuit of FIG. 4A.

FIG. 4C is a schematic diagram illustrating one exemplary row-specific Iread boost circuit 480, which can be incorporated into the row decoder of the peripheral circuitry 491 for the rows a-n in the memory circuit 400.

As illustrated, the Iread boost circuit 480 can include of a pair of coupling capacitors (CCs) (e.g., a first CC 489.1 and a second CC 489.2). The CCs 489.1 and 489.2 can be connected in series between a first boost node 471 on the WL 440 for the row and a second boost node 472 on the VSL 421 for the same row.

The Iread boost circuit 480 can include a WL driver 485. The WL driver 485 can include a first PFET 473 and a first NFET 474, which are connected in series between the positive supply voltage rail 420 and a ground rail 422. As mentioned above, the positive supply voltage rail 420 can be set at a first positive supply voltage level (e.g., at a relatively low VDD). The WL driver 485 can also include a WL driver output node 475, which is at the junction between the first PFET 473 and the first NFET 474 and which is connected to the WL 440 for the row (e.g., adjacent to the first boost node 471).

The Iread boost circuit 480 can include a coupling capacitor (CC) driver 487. The CC driver 487 can include a second PFET 476 and a second NFET 477, which are connected in series between the positive supply voltage rail 420 and the ground rail 422. The CC driver 487 can include a CC driver output node 478, which is at the junction between the second PFET 476 and the second NFET 477 and which is connected to an intermediate node 469 between the CCs 489.1 and 489.2.

The Iread boost circuit 480 can include a header switch 488. The header switch 488 can be, for example, a third PFET 479, which is connected in series between the positive supply voltage rail 420 and the VSL 421 for the row (e.g., adjacent to the second boost node 472).

The Iread boost circuit 480 can further include a synchronization circuit 468, which has an input node 497 for receiving a row-specific read control signal. It should be noted initiation or completion of a read operation in any selected memory cell within the row can be triggered depending upon the state (i.e., high or low) of this row-specific read control signal. In some embodiments, the read control signal can be an inverted read clock signal (RCLKb). That is, the read control signal can be an inverted version of a read clock signal (RCLK) arriving at the input node 497. In this case, switching of RCLKb from high to low on the input node 497 can trigger the initiation of a read operation in any selected memory cell within the row to which the Iread boost circuit 480 is connected, whereas switching of RCLKb from low to high on the input node 497 can signal the end of this read operation.

The synchronization circuit 468 can be configured to cause the WL driver 485 to initially increase the voltage level on the WL 440 from ground to the first positive supply voltage level when the RCLKb on the input node 497 goes low and, once the WL for the row has reached the first positive supply voltage level, to automatically cause the CC driver 487 to simultaneously charge the CCs 489.1 and 489.2 and, thereby concurrently and temporarily increase the voltage levels on both the WL 440 and the VSL 421 for the row (e.g., from the first positive supply voltage level to the second positive supply voltage level).

The synchronization circuit 468 can further be configured to cause the WL driver 485 to drop the voltage level on the WL 440 to ground and to cause the CC driver 487 to stop charging the CCs 489.1 and 489.2 so that the voltage level on the VSL 421 drops back to the first positive supply voltage level, when RCLKb on input node 497 switches back to high signaling the end of the read operation.

In some embodiments, the synchronization circuit 468 can include multiple logic gates to adjust the voltage levels on the WL and the VSL, as described above. The logic gates can include: a pair of inverters (i.e., a first inverter 481 and a second inverter 483); an OR gate 482; an AND gate 484; and a NAND gate 486.

The first inverter 481 and the second inverter 483 can be connected in series-between the input node 497 and the gate of the first NFET 474 of the WL driver 485. The first inverter 481 can receive RCLKb from the input node 497, can invert RCLKb to RCLK, and can output RCLK to the second inverter 483. The second inverter 483 can receive RCLK, can invert RCLK to a first wordline driver control signal (WLDCN), and can apply WLDCN to the gate of the first NFET 474 of the WL driver 485.

The AND gate 484 can receive a pair of inputs including RCLK from the first inverter 481 and a feedback signal (FBK), which is transmitted along a feedback path 467 to the AND gate 484 from the WL driver output node 475. The AND gate 484 can perform a conventional logical AND conjunction and can output a synchronization control signal (SC). Those skilled in the art will recognize that with a conventional logical AND conjunction SC will be low (i.e., with a logic value of "0") unless both of the inputs to the AND gate are high (i.e., have logic values of "1").

The OR gate 482 can receive a pair of inputs including RCLKb from the input node 497 and SC from the AND gate 484. The OR gate 482 can perform a conventional logical OR conjunction, can output a second wordline driver control signal (WLDCP), and can apply WLDCP to the gate of the first PFET 473 of the WL driver 485. Those skilled in the art will recognize that with a conventional logical OR conjunction WLDCP will be high (i.e., with a logic value of "1") unless both of the inputs to the OR gate are low (i.e., have logic values of "0").

The NAND gate 486 can receive a pair of inputs including SC from the AND gate 484 and WLDCP from the OR gate 482. The NAND gate 486 can perform a conventional logical NAND conjunction, can output a CC driver control signal (CCDC), and can apply the CCDC to the gates of the second PFET 476 and the second NFET 477 of the CC driver 487.

RCLK from the first inverter 481 of the synchronization circuit 468 can also be applied to the gate of the third PFET of the header switch 488. Optionally, the synchronization circuit 468 can include a delay element 463 (e.g., a resistor) in line between the output of the first inverter 481 and the gate of the third PFET 479 of the header switch 488 downstream of the input to the AND gate 484.

Referring to FIG. 4C in combination with the timing diagram of FIG. 5, a read operation directed to a selected 6T-SRAM cell within a specific row and a specific column of the array can proceed as follows.

Prior to the read operation (see time T1 of FIG. 5), RCLKb on the input node 497 of the Iread boost circuit 480 for the specific row will be high. RCLK will be low and the third PFET of the header switch 488 will be turned on, thereby maintaining the voltage level on VSL 421 for the specific row at the first positive supply voltage level (e.g., at VDD). Furthermore, WLDCN and WLDCP will both be high so that only the first NFET 474 of the WL driver 485 is turned on, so that the WL driver output node 475 is pulled down, and the WL 440 for the row is at ground. Thus, the inputs to the AND gate 484 (i.e., RCLK and FBK) are low and low and the output from the AND gate 484 (i.e., SC) is low. The inputs to the OR gate 482 (i.e., SC and RCLKb) are low and high and the output from the OR gate 482 (i.e., WLDCP) is high, keeping the first PFET 473 of the WL driver 485 turned OFF. The inputs to the NAND gate 486 (i.e., SC and WLDCP) are low and high and the output of the NAND gate 486 (i.e., CCDC) is high. Thus, the second PFET 476 of the CC driver 487 is turned OFF, the second NFET 477 of the CC driver 487 is turned ON, and the voltage level on the CC driver output node 478 is pulled down. As a result, at time T1, the CCs 489.1 and 489.2 are uncharged and the voltage levels on the WL 440 and the VSL 421 for the row are stable at ground and the first positive supply voltage level, respectively.

Prior to the initiation of the read operation, the column decoder in the peripheral circuitry 492 for the columns can, in response to some control signal (e.g., from the controller 495), cause the bitlines (BLT and BLC) for the specific column to be pre-charged to the first positive supply voltage level. It should be noted that BL pre-charging for read operations is known in the art and, thus, the details have been omitted from this specification in order to allow the reader to focus on the salient aspects of the disclosed embodiments.

Figure 5:
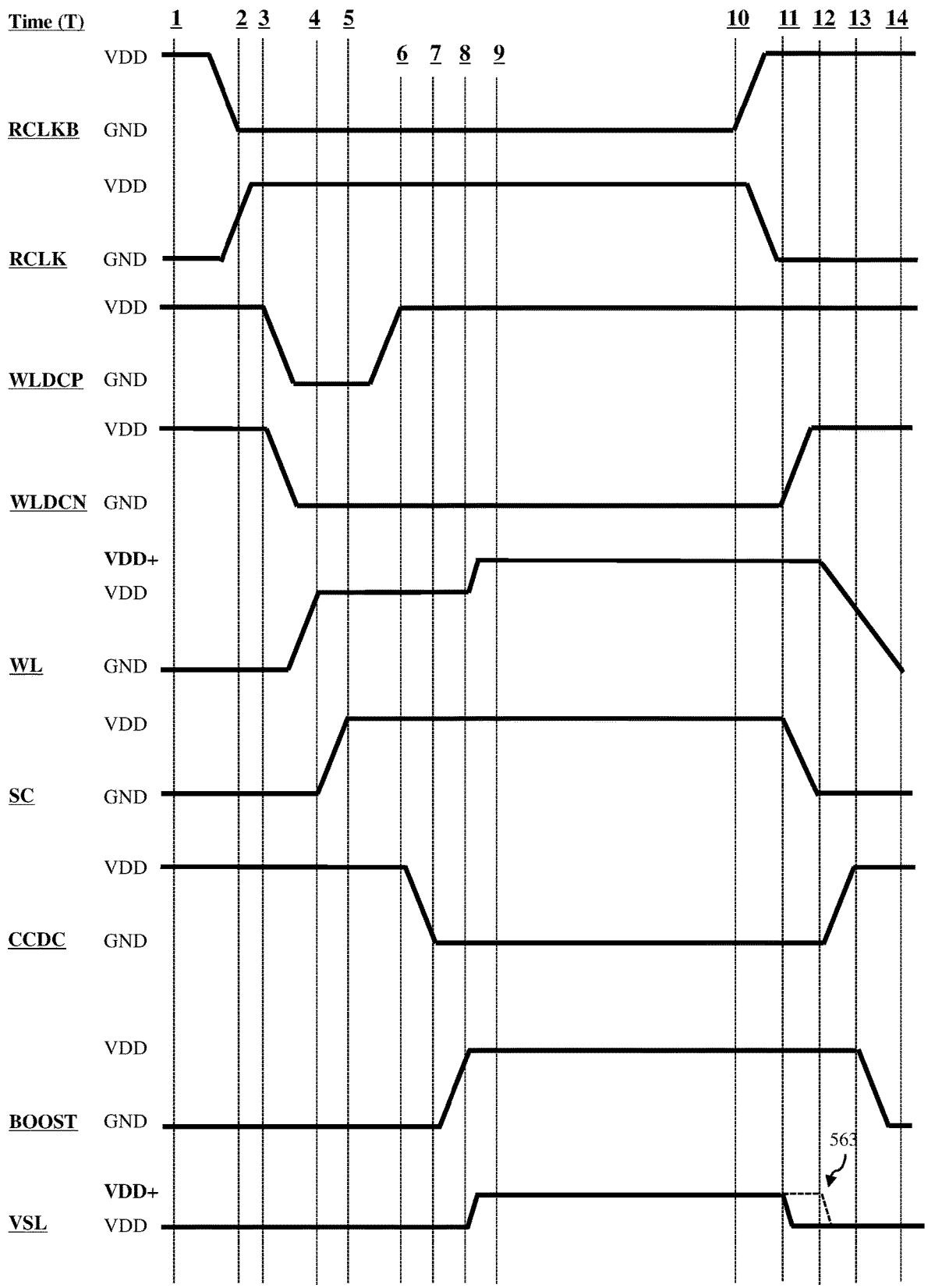
FIG. 5 is a timing diagram illustrating states of signals within a row-specific boost circuit during a read operation directed to a selected SRAM cell.

Following pre-charging of the BLs for the specific column, RCLKb switches from high to low, thereby triggering initiation of the read operation (see time T2 of FIG. 5). Even though RCLKb switches to low, the output of the AND gate 484 (i.e., SC) will remain low and, thus, the output of the OR gate 482 (i.e., WLDCP) will switch to low, thereby turning on the first PFET 473 of the WL driver 485. Additionally, when RCLKb switches to low, the output of the first inverter 481 (i.e., RCLK) goes high. When RCLK goes high, the third PFET 479 of the header switch 488 turns OFF and the output of the second inverter 483 (i.e., WLDCN) will go low (see time T3 of FIG. 5). When WLDCN goes low, the first NFET 474 of the WL driver turns OFF. Thus, the first PFET 473 is turned ON, the first NFET 474 is turned OFF, and the voltage level on the WL driver output node 475 is pulled up and, thus, so are the voltage levels on the WL 440 and the feedback path 467 (see time T4 of FIG. 5). At this point the WL has been activated (i.e., the voltage level on the WL has been increased from ground to the first positive supply voltage level to enable turning ON of the access transistors).

When the voltage level on the WL driver output node 475 has been pulled up, the inputs to the AND gate 484 (i.e., RCLK and FBK) will be high and high. Thus, the output of the AND gate 484 (i.e., SC) will switch from low to high (see time T5 of FIG. 5). When SC switches from low to high, the output of the OR gate 482 (i.e., WLDCP) will switch from low to high, thereby turning OFF the first PFET 473 of the WL driver 485 (after the WL driver output node 475 has been pulled up). It should be noted the first NFET 474 of the WL driver 485 remains OFF and, thus, the voltage level on the WL driver output node 475 remains high (see time T6 of FIG. 5). When WLDCP switches from low to high, the inputs to the NAND gate 486 (i.e., SC and WLDCP) will both be high and, as a result, the output of the NAND gate 486 (i.e., CCDC) will switch to low (see time T7 of FIG. 5). When CCDC is low, the second PFET 476 of the CC driver 487 turns ON and the second NFET 477 turns OFF so that the CC driver output node 478 is pulled up, thereby charging the CCs 489.1 and 489.2 so BOOST goes high (see time T8 of FIG. 5). Charging the CCs 489.1-489.2, in turn, results in concurrent and, more particularly, simultaneous boosting of the voltage levels on the WL 440 and the VSL 421 for the specific row. It should be noted that the CCs 489.1-489.2 can be the same size so that the voltage levels on the WL and the VSL are both boosted from the same first positive supply voltage level (e.g., VDD) to the same second positive supply voltage level (e.g., to VDD+) (see time T9 of FIG. 5).

Consider a read operation where a selected 6T-SRAM cell in a specific row and a specific column has a stored data value of "0" on the first data storage node 405 and a complement stored data value of "1" on the second data storage node 415. As discussed above, prior to initiation of the read operation, the BLT 431 and BLC 432 are pre-charged to the first positive supply voltage level. At time T1, the first and second access transistors 404, 414 will be turned OFF. The second data storage node 415 will be at the first positive supply voltage level (indicative of the complement stored data value of "1") and, thus, the first pull-up transistor 402 will be OFF, the first pull-down transistor 403 will be ON, and the voltage level on the first data storage node 405 will be maintained at ground (indicative of the stored data value of "0"). Furthermore, since the first data storage node 405 is at ground, the second pull-up transistor 412 will be ON, the second pull-down transistor 413 will be OFF, and the voltage level on the second data storage node 415 will be maintained at the first positive supply voltage level. However, at time T9, the WL 440 for a row containing this selected 6T-SRAM cell has been activated (i.e., the voltage level on the WL for the row has been increased from ground to the first positive supply voltage level). Thus, the first and second access transistors 404 and 414 have turned ON and, due to the first data storage node 405 being at ground and BLT 431 being pre-charged, a read current (Tread) will flow from the BLT 431 through the first access transistor 404 toward the first data storage node 405, thereby causing the voltage level on BLT 431 to drop.

Additionally, at time T9, the voltages levels on the WL 440 and the VSL 421 have also been boosted (e.g., from the first positive supply voltage level to the second positive supply voltage level (e.g., VDD+)). As a result, the drive strengths of the first and second access transistors 404 and 414 have been increased due to the application of the higher voltage on their respective gates by the WL 440. Additionally, the voltage level on the second data storage node 415 has been pulled up to the second positive supply voltage level through the second pull-up transistor 412 (which is ON) and, thus, the drive strength of the first pull-down transistor 403 has been increased due to the application of the higher voltage on its gate by the second data storage node 415. The voltage level on BLC 432 (VBLC) will typically remain at the first positive supply voltage level.

However, it should be noted that, depending upon the level of the boost voltage applied to the gate of the second access transistor 414, VBLC could possibly be pulled up. By increasing the drive strengths of both the first access transistor 404 and the first pull-down transistor 403 during the read operation, the amount of read current (Tread) that will flow from the pre-charged BLT 431 in the direction of the first data storage node 405 (which is at ground indicating storage of a "0" data values) will be increased (i.e., boosted) such that the voltage level on BLT (i.e., VBLT) will drop by a greater amount that it would otherwise.

For example, in some embodiments, Iread can be boosted from less than 0.5 µA (e.g., from approximately 0.38 µA or less), which only results in a minimal drop in VBLT, to greater than 1.5 µA (e.g., to approximately 2.1 µA or more), which results in a significant drop in VBLT.

Figure 2:
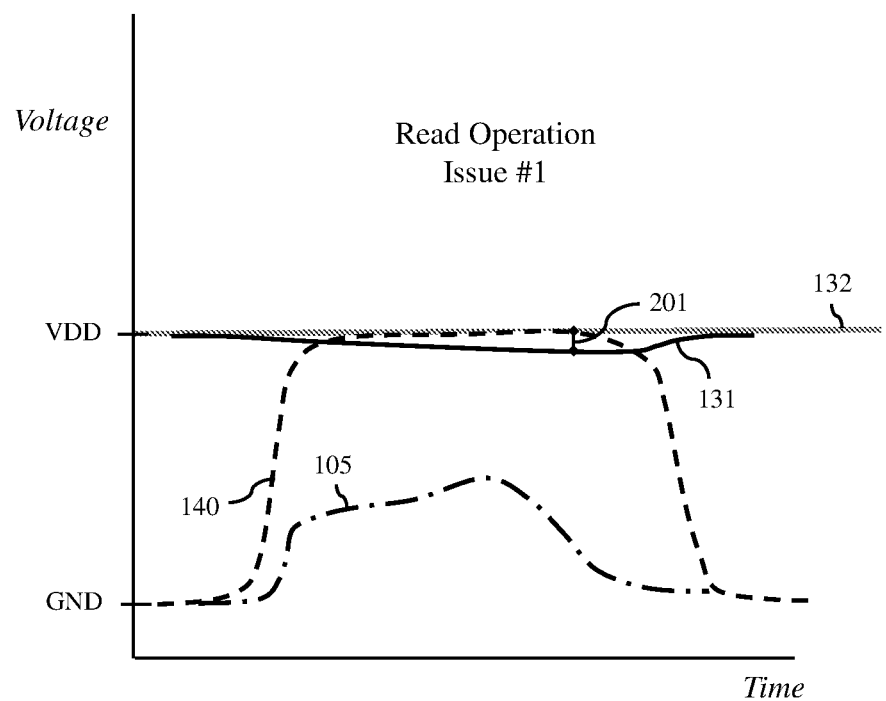
FIG. 2 is a graph illustrating a read sense fail in a 6T-SRAM cell.
Figure 3:
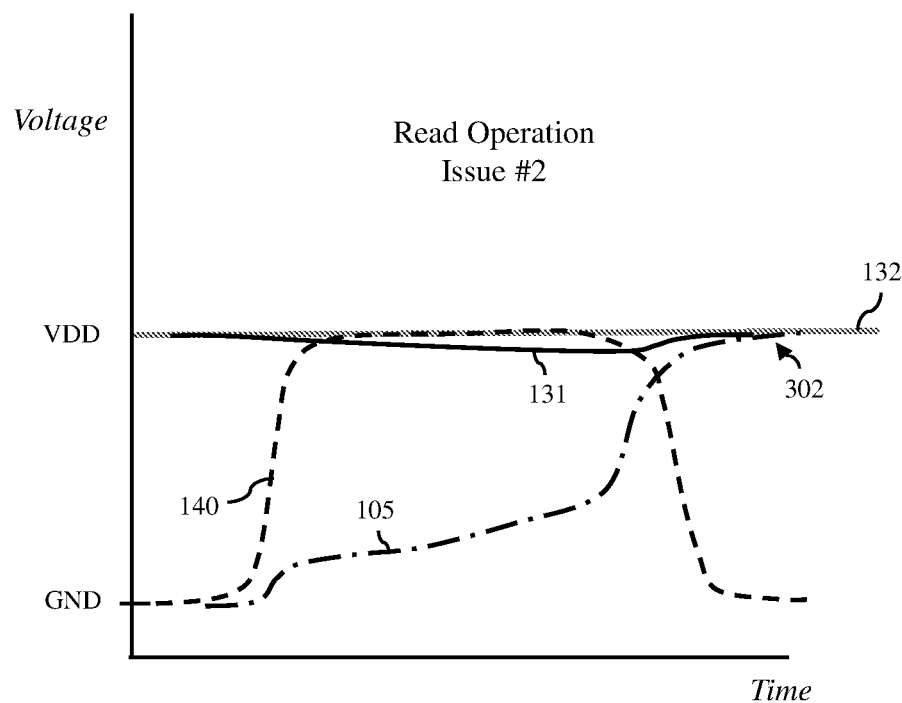
FIG. 3 is a graph illustrating a read stability fail in a 6T-SRAM cell.
Figure 6A:
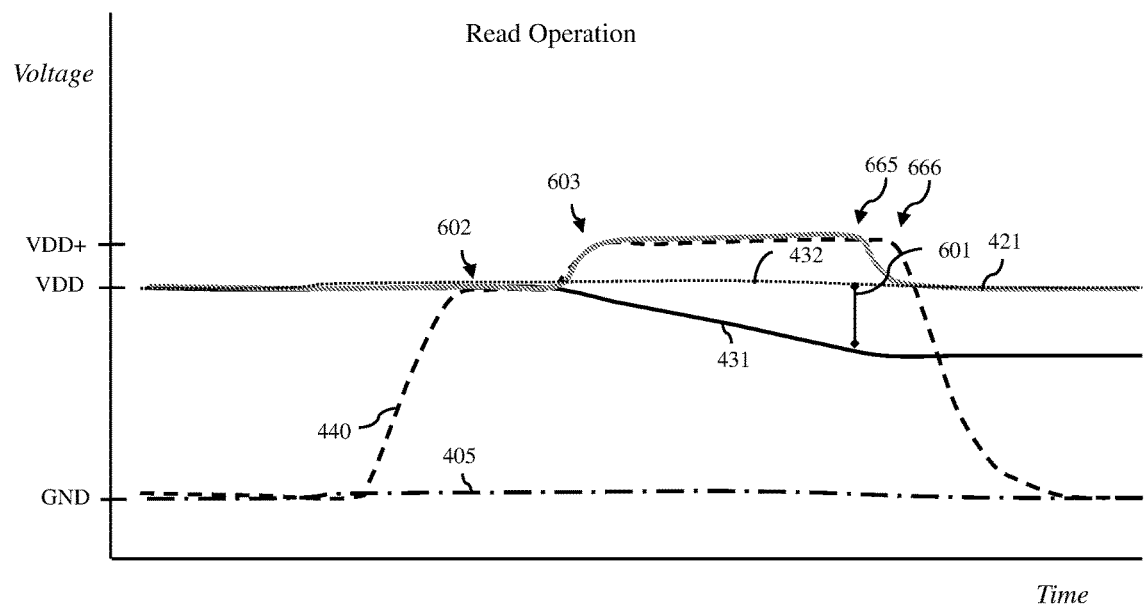
FIGS. 6A and 6B are different graphs illustrating exemplary voltage level changes on BLT, BLC, WL, and VSL during a read operation with Iread boosting.
Figure 6B:
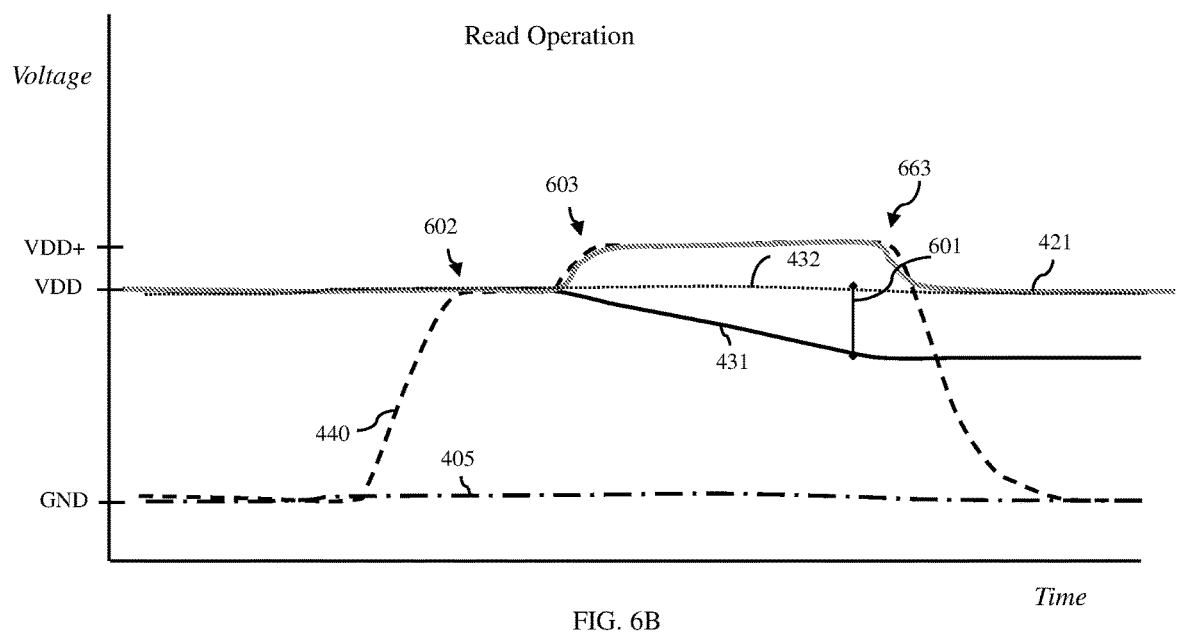

More specifically, as illustrated in the graphs of FIGS. 6A and 6B, during the read operation after BLT 431 and BLC 432 have been pre-charged to the first positive supply voltage level (e.g., VDD) and after the WL has been activated (i.e., the voltage level has been increased from ground to the first positive supply voltage level (see time 602)), the voltage levels on the WL 440 and the VSL 421 for the row are essentially simultaneously boosted to the second positive supply voltage level (e.g., VDD+) and because the first data storage node 405 is low, the voltage level on BLT 431 (VBLT) will begin to drop (see time 603). As a result of the boosted voltage on the WL and the VSL, the differential 601 between the reduced voltage level on BLT 431 (VBLT) and the voltage level on BLC 432 (VBLC) (which as mentioned above will typically remain at the first positive supply voltage level, e.g. VDD) will be significantly increased over this differential if Iread had not been boosted (e.g., as illustrated in FIG. 2, discussed above). In some embodiments, this differential 601 can be increased from less than 50 mV (e.g., from approximately 36 mV or less) without the Iread boost to more than 100 mV (e.g., to approximately 149 mV or more) with the Iread boost. This increase in the differential 601 ensures that it is detectable by the sense circuit and that the value of the stored data on the first data storage node 405 can be accurately determined. Thus, a read sense fail (e.g., a fail where the drop in the voltage level on BLT is not sufficiently detectable so the value of the stored data on the first data storage node 405 is incorrectly read as a "1") can be avoided. Furthermore, by pulling up the voltage level on the second data storage node 415 to the second positive supply voltage level during this read operation and by increasing the drive strength of the first pull-down transistor 403, the first pull-up transistor 402 remains OFF and the first pull-down transistor 403 continually pulls down the voltage level on the first data storage node 405 to ground. Thus, a read stability fail (also referred to as an SNM fail) (e.g., a fail where the read operation results in switching of the stored data value) can also be avoided.

At some time T10, when RCLKb switches from low back to high to signal the end of the read operation, the output of the first inverter 481 (i.e., RCLK) will switch to low. Once RCLK switches to low, the third PFET 479 of the header switch 488 will switch ON and pull the voltage level on the VSL 421 back down from the second positive supply voltage level (e.g., VDD+) to the first positive supply voltage level (e.g., VDD) (see time T11). As mentioned above, optionally, the line between the output of the first inverter 481 and the gate of the third PFET 479 can include a delay element 463 downstream of the input to the AND gate 484. This delay element 463 can be configured specifically to delay switching of the third PFET 479 to the ON state and, thereby to delay pulling down the voltage level on VSL 421. The delay of the delay element 463 can, for example, be set so that the drop in the voltage level on VSL 421 from the second positive supply voltage level to the first positive supply voltage level coincides with a drop in the voltage level on the WL 440 from the second positive supply voltage level (e.g., VDD) to ground at time T12, discussed below (see optional delay indicated by reference number 563 in FIG. 5).

It should be noted that the graph of FIG. 6A illustrates an exemplary read operation where the synchronization circuit 468 does not incorporate the optional delay element 463 and, thus, at the end of the read operation the voltage level on the VSL 421 begins to drop at time 665 and shortly thereafter at time 666 the voltage level on the WL 440 begins to drop. The graph of FIG. 6B illustrates an exemplary read operation where the synchronization circuit 468 does incorporate a delay element 463 and, thus, at the end of the read operation the voltage levels on the VSL 421 and on WL 440 begin to drop at approximately the same time (see time 663) (e.g., see also the shifted voltage drop of the VSL represented by the dotted line 563 in FIG. 5).

In any case, additionally, at time T11, the output of the second inverter 483 (i.e., WLDCN) will switch from low to high and the output of the AND gate 484 (i.e., SC) will switch from high to low. When SC is low and WLDCP is high at time T12, the output of the NAND gate 486 (i.e., CCDC) will switch back to high. Additionally, at time T12, when WLDCN is high and SC is low, the first NFET 474 of the WL driver 485 will switch back ON and the output of the OR gate 482 (i.e., WLDCP) will remain high so the first PFET 473 stays OFF. As a result, the first NFET 474 pulls down the voltage level on the WL driver output node 475 from the second positive supply voltage level (e.g., VDD+) to ground and, thereby pulls down the voltage level on the WL 440 from the second positive supply voltage level (e.g., VDD+) to ground. At time T13, CCDC is high so the second PFET 476 of the CC driver 487 will switch OFF and the second NFET 477 of the CC driver 487 will switch ON. Thus, the CC driver output node 478 will be pulled back down to ground. At time T14, the CCs 489.1 and 489.2 are no longer charged or boosting the voltage levels on the WL 440 and the VSL 421. It should be noted that, when the WL driver output node 475 is low, the FBK input to the AND gate 484 will also be low; however, since RCLK is low at this time, SC will remain low.

In the embodiments described above, the CCs 489.1-489.2 are described as being essentially identical so that when they are simultaneously charged by the same CC driver output node 478, the voltage levels on the WL 440 and the VSL 421 are simultaneously boosted by essentially the same amount (e.g., approximately 100 mV) from the same first positive supply voltage level (e.g., a VDD of approximately 0.45V) to the same second positive supply voltage level (e.g., a VDD+ of approximately 0.55V). It should be understood, however, that the description is not intended to be limiting. Alternatively, the CCs 489.1-489.2 could be different and, more particularly, could have different sizes. Thus, when the CCs 489.1-489.2 are simultaneously charged from the same CC driver output node 478, the voltage levels on the WL 440 and the VSL 421 will be simultaneously increased but by different amounts. As a result, the voltage levels on the WL 440 and the VSL 420 would both be greater than the first positive supply voltage level but different (e.g., at VDD+ and VDD++).

Finally, it should be noted that because, in this case, each Iread boost circuit 480a-480n within the row decoder of the peripheral circuitry 491 for the rows incorporates a WL driver 485, which activates the WL for a specific row upon initiation of a read operation (e.g., in response to switching of RCLKb from high to low), and further incorporates a CC driver 487, which is synchronized with the WL driver 485 so that the voltage levels on the WL and the VSL connected to the Iread boost circuit can be concurrently boosted and temporarily boosted in a synchronized manner during the read operation, the row decoder can also include discrete circuitry (e.g., discrete WL drivers, not shown) for facilitating write operations. It should be noted that, since peripheral circuitry for facilitating write operations is generally known in the art, the details of such circuitry has been omitted from this specification in order to allow the reader to focus on the salient aspects of the disclosed embodiments.

Figure 7:
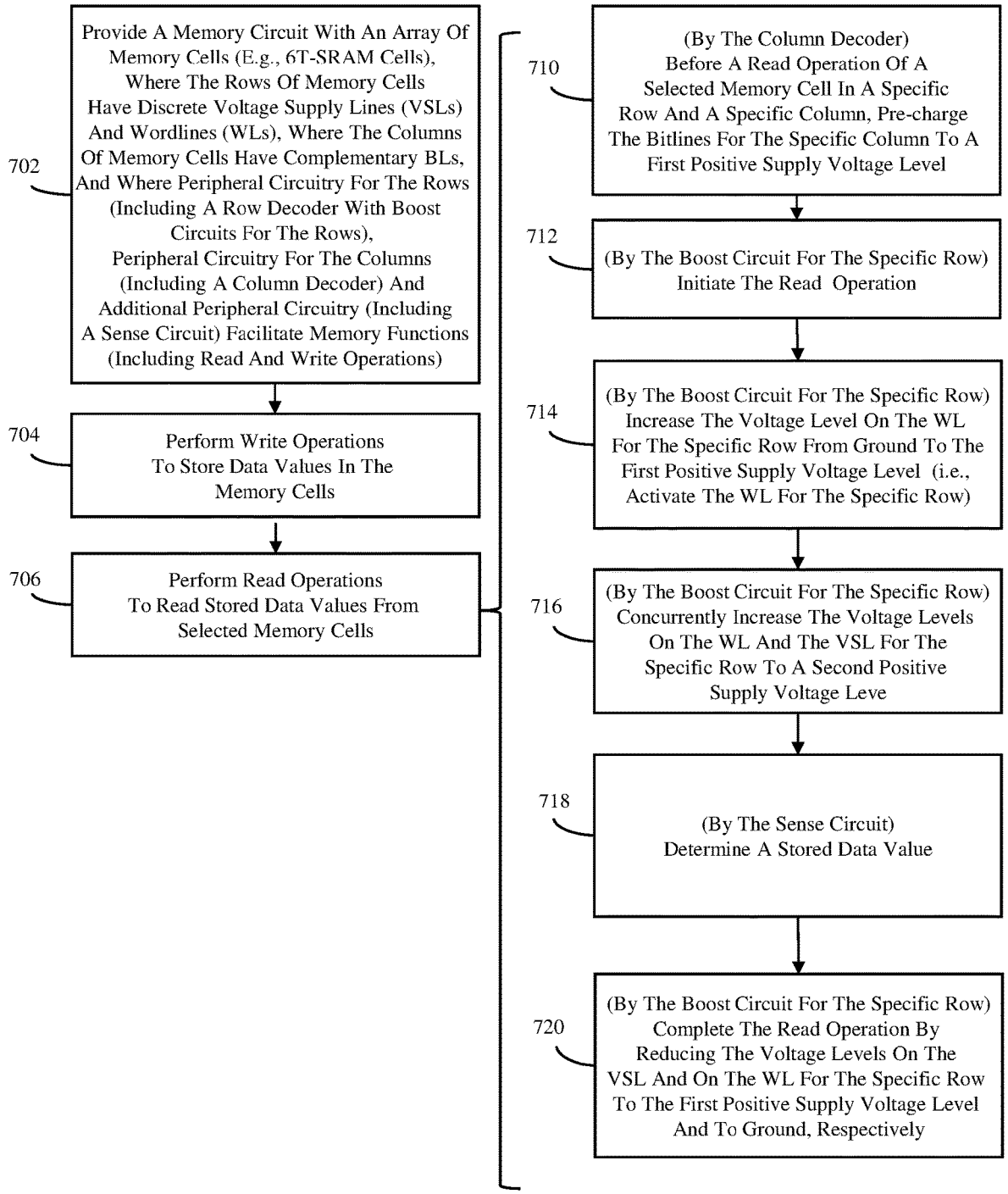
FIG. 7 is a flow diagram illustrating disclosed method embodiments.

Referring to the flow diagram of FIG. 7, also disclosed herein are method embodiments associated with the above-described memory circuit embodiments.

Specifically, the method embodiments can include providing a memory circuit, such as the memory circuit 400 described in detail above and illustrated in FIGS. 4A-4C. Generally, this memory circuit 400 can include an array of memory cells 401, which are arranged in rows a-n and columns A-N, as shown in FIG. 4A. The memory cells 401 can be, for example, static random access memory (SRAM) cells such as six-transistor (6T) SRAM cells, as shown in FIG. 4B. The memory circuit 400 can also include wordlines (WLs) 440a-440n, voltage supply lines (VSLs) 421a-421n, and boost circuits 480a-480n for the rows a-n. Specifically, each WL 440a-440n for each row a-n can be connected to all of the memory cells 401 in that row. Each VSL 421a-421n for each row a-n can be connected to all of the memory cells 401 in that row and can provide a positive supply voltage thereto. The memory circuit 400 can further include a controller 495 and peripheral circuitry, which is connected to the array, which is powered by a positive voltage rail 420 (which is set at a first positive supply voltage level, such as at a relative low VDD), which is in communication with the controller 495, and which is configured to facilitate various memory functions (e.g., read operations and write operation) in response to control signals from the controller 495. As discussed in detail above, the peripheral circuitry can include peripheral circuitry 491 for the rows (including a row decoder with the boost circuits 480a-480n for the rows a-n), peripheral circuitry 492 for the columns (including a column decoder) and additional peripheral circuitry 493 (including a sense circuit).

The method embodiments can further include using the peripheral circuitry 491-493 to facilitate the performance of memory functions (see process steps 704-706). The memory functions can include write operations to store data values on the data storage nodes of selected memory cells 401 and read operations to read stored data values from the data storage nodes of selected memory cells 401. The method embodiments can further include, during a memory function directed at a selected memory cell in a specific row and a specific column, activating a WL for the specific row containing the selected memory cell (i.e., increasing the voltage level on the WL for the specific row from ground to a first positive voltage level (e.g., to VDD)). Activation of the WL for the row can be performed by the boost circuit for the specific row. The method embodiments can further include, during the memory function after activation of the WL for the specific row, concurrently and temporarily increasing the voltage levels on both the WL and the VSL for the specific row. Boosting the voltage levels on the WL and the VSL for the specific row can be performed by the boost circuit for the specific row. Boosting of the WL and the VSL for the specific row can, for example, include concurrently and temporarily increasing the voltage levels on the WL and the VSL for the row from the first positive supply voltage level to a second positive supply voltage level (e.g., to VDD+), which is greater than the first positive voltage level, and doing so in a synchronized manner in order to improve performance, reduce fails, etc.

In some cases, the row-specific boost circuits 480a-480n can specifically be row-specific read current (Iread) boost circuits, which are incorporated into the row decoder of the peripheral circuitry for the rows and which are specifically configured to facilitate the performance of read operations.

For example, before a read operation of a selected 6T-SRAM cell in a specific row and a specific column of the memory array is initiated, BL pre-charging can be performed (see process step 710). Specifically, the bitlines (BLT and BLC) for the specific column can be pre-charged to the first positive supply voltage level. BL pre-charging for the specific column can be performed by the column decoder and in response to some control signal (e.g., from the controller).

The read operation can then be initiated (see process step 712). Initiation of the read operation can be performed by the Iread boost circuit for the specific row in response to switching of the state (e.g., from high to low) of a row-specific read control signal received at the input node of the Iread boost circuit.

After the read operation has been initiated, the voltage level on the WL for the specific row can be increased from ground to the first positive supply voltage level (i.e., the WL for the specific row can be activated) (see process step 714). Activation of the WL for the specific row can be performed by the Iread boost circuit for the specific row in response to the switching of the read control signal.

After the WL for the specific row has been activated, the voltage levels on the WL and the VSL for the specific row can be concurrently and temporarily increased (see process step 716). The voltage levels on the WL and the VSL for the specific row can be concurrently and temporarily increased by the Iread boost circuit for the specific row. The voltage levels on the WL and the VSL for the specific row can, for example, be concurrently and temporarily increased from the first positive supply voltage level to a second positive supply voltage level (e.g., to VDD+), which is greater than the first positive voltage level, in order to reduce read fails (as discussed in greater detail below).

While the voltage levels on the WL and the VSL for the specific row are boosted, a stored data value within the 6T-SRAM cell can be determined (see process step 718). For example, the stored data value can be determined by the sense circuit, which is configured to detect a difference between the voltage levels (VBLT and VBLC) on the bitlines (BLT and BLC, respectively) for the specific column. For example, if the sense circuit determines that VBLT <VBLC, then the stored data value on the first data storage node is a "0" and vice versa.

It should be noted that increasing the voltage levels on WL and VSL for the specific row at process step 716 and then performing the sense operation at process step 718 effectively reduces the likelihood of a read fail. For example, if the 6T-SRAM cell stores a data value of "0" on the first data storage node 405 and a complement data value of "1" on the second data storage node 415, then when the WL 440 connected to the 6T-SRAM cell has been activated at process step 714 and the voltage levels on the WL 440 and the VSL 421 connected to the 6T-SRAM cell have been boosted at process step 716, the drive strengths of the first and second access transistors 404 and 414 will be increased due to application of the higher voltage on their respective gates by the WL 440. Additionally, the voltage level on the second data storage node 415 will be pulled up to the second positive supply voltage level through the second pull-up transistor 412 (which is ON) and, thus, the drive strength of the first pull-down transistor 403 will also be increased due to the application of the higher voltage on its gate by the second data storage node 415. By increasing the drive strengths of both the first access transistor 404 and the first pull-down transistor 403 when the first data storage node 405 stores a data value of "0", the amount of read current (Iread) that will flow from the pre-charged BLT 431 in the direction of the first data storage node 405 is boosted and, thus, the drop in the voltage level on BLT 431 (i.e., VBLT) is increased over what it would otherwise be without Iread boost.

More particularly, as discussed in detail above with regard to the memory circuit embodiments, by increasing the drive strengths of both the first access transistor 404 and the first pull-down transistor 403 during the read operation, the amount of read current (Iread) that will flow from the pre-charged BLT 431 in the direction of the first data storage node 405 (which is at ground indicating storage of a "0" data values) will be increased (i.e., boosted) and so will the drop in VBLT. For example, in some embodiments, Iread can be boosted from less than 0.5 µA (e.g., from approximately 0.38 µA or less) to greater than 1.5 µA (e.g., to approximately 2.1 µA or more). As illustrated in the graph of FIGS. 6A-6B, by boosting Iread in this manner, the differential 601 between the reduced voltage level on BLT 431 (VBLT) and the voltage level on BLC 432 (VBLC) (which, as mentioned above with regards to the circuit embodiments, typically remains at the first positive voltage level) can be significantly increased. For example, in some embodiments, this differential 601 can be increased from less than 50 mV (e.g., from approximately 36 mV or less) without Iread boosting to more than 100 mV (e.g., to approximately 149 mV or more) with Iread boosting. The increase in the differential 601 ensures that it is detectable by the sense circuit and that the value of the stored data on the first data storage node 405 can be accurately determined at process step 718. Thus, a read sense fail (e.g., a fail where the drop in the voltage level on BLT is not sufficiently detectable so the value of the stored data on the first data storage node 405 is incorrectly read as a "1") can be avoided at process step 718. Furthermore, by pulling up the voltage level on the second data storage node 415 to the second positive supply voltage level during this read operation and increasing the drive strength of the first pull-down transistor 403, the first pull-up transistor 402 remains OFF and the first pull-down transistor 403 continually pulls down the voltage level on the first data storage node 405 to ground. Thus, a read stability fail (also referred to as an SNM fail) can also be avoided at process step 718.

Following process step 718, the read operation can be completed by reducing the voltage levels on VSL and on the WL for the specific row to the first positive supply voltage level and to ground, respectively (see process step 720). Completion of the read operation can be performed by the Iread boost circuit for the specific row in response to switching of the state (e.g., from low back to high) of the row-specific read control signal received at the input node of the Iread boost circuit.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   memory cells arranged in rows and columns;
   wordlines for the rows, wherein each wordline for each row is connected to all of the memory cells in the row;
   voltage supply lines for the rows, wherein each voltage supply line for each row is connected to all of the memory cells in the row; and
   boost circuits for the rows, wherein each boost circuit for each row is connected to the wordline for the row and to the voltage supply line for the row and comprises:
      two coupling capacitors connected in series between the wordline and the voltage supply line for the row; and
      a coupling capacitor driver with a coupling capacitor driver output node connected to an intermediate node between the two coupling capacitors.

2. The structure of claim 1, wherein each boost circuit for each row is configured to perform boosting of voltage levels on the wordline and the voltage supply line for the row.

3. The structure of claim 1, wherein each boost circuit for each row is configured to increase voltage levels on the wordline and the voltage supply line for the row during a read operation to read a stored data value in a memory cell in the row.

4. The structure of claim 3, wherein the increasing of the voltage levels on the wordline and the voltage supply line for the row during the read operation boosts read current.

5. The structure of claim 3, further comprising a positive voltage rail at a first positive voltage level,
   wherein each boost circuit for each row is connected to the positive voltage rail,
   wherein each boost circuit for each row is configured to increase a voltage level on the wordline for the row from ground to the first positive voltage level upon initiation of the read operation, and
   wherein each boost circuit for each row is further configured to increase the voltage levels on both the wordline and the voltage supply line for the row from the first positive voltage level to a second positive voltage level that is greater than the first positive voltage level when the voltage level on the wordline has reached the first positive voltage level.

6. The structure of claim 5, wherein each boost circuit for each row comprises:
   a wordline driver with a wordline driver output node connected to the wordline;
   a header switch connected between the positive voltage rail and the voltage supply line for the row;
   a synchronization circuit connected to the wordline driver, the coupling capacitor driver, and the header switch; and
   a feedback path from the wordline driver output node to the synchronization circuit, wherein the feedback path ensures that the synchronization circuit causes synchronized and concurrent increasing of the voltage levels on the wordline and the voltage supply line for the row when the wordline driver has switched the voltage level on the wordline to the first positive voltage level.

7. The structure of claim 1, wherein the memory cells comprise static random access memory cells.

8. A structure comprising:
   memory cells arranged in rows and columns;
   wordlines for the rows, wherein each wordline for each row is connected to all of the memory cells in the row;
   voltage supply lines for the rows, wherein each voltage supply line for each row is connected to all of the memory cells in the row; and
   boost circuits for the rows,
   wherein each boost circuit for each row is connected to the wordline for the row and to the voltage supply line for the row,
   wherein each boost circuit for each row comprises:
      two coupling capacitors connected in series between the wordline and the voltage supply line for the row; and
      a coupling capacitor driver with a coupling capacitor driver output node connected to an intermediate node between the two coupling capacitors, and
   wherein each boost circuit for each row is configured to perform synchronized and concurrent increasing of voltage levels on the wordline and the voltage supply line for the row.

9. The structure of claim 8, further comprising: first and second bitlines for the columns, wherein each memory cell in each specific row and specific column comprises a six-transistor static random access memory cell comprising:

a first inverter comprising a first pull-up transistor and a first pull-down transistor connected in series between the voltage supply line for the specific row and a ground rail;
a second inverter cross-coupled to the first inverter and comprising a second pull-up transistor and a second pull-down transistor connected in series between the voltage supply line for the specific row and the ground rail;
a first access transistor connected in series between a first bitline for the specific column and a first storage node at a junction between the first pull-up transistor and the first pull-down transistor; and
a second access transistor connected between a second bitline for the specific column and a second storage node at a junction between the second pull-up transistor and the second pull-down transistor,
wherein the wordline for the specific row is connected to gates of the first access transistor and the second access transistor.

10. The structure of claim 8, further comprising a controller causing one boost circuit for one row at a time to perform the synchronized and concurrent increasing of the voltage levels on the wordline and the voltage supply line for the one row.

11. The structure of claim 8, wherein each boost circuit for each row is configured to perform the synchronized and concurrent increasing of the voltage levels on the wordline and the voltage supply line for the row during a read operation in order to boost read current.

12. The structure of claim 11, further comprising a positive voltage rail at a first positive voltage level,
wherein each boost circuit for each row is connected to the positive voltage rail,
wherein each boost circuit for each row is configured to increase a voltage level on the wordline for the row from ground to the first positive voltage level upon initiation of the read operation, and
wherein each boost circuit for each row is further configured to increase the voltage levels on the wordline and the voltage supply line for the row from the first positive voltage level to a second positive voltage level that is greater than the first positive voltage level when the voltage level on the wordline has reached the first positive voltage level.

13. The structure of claim 12, wherein each boost circuit for each row comprises:
a wordline driver with a wordline driver output node connected to the wordline;
a header switch connected between the positive voltage rail and the voltage supply line for the row;
a synchronization circuit connected to the wordline driver, the coupling capacitor driver, and the header switch; and
a feedback path from the wordline driver output node to the synchronization circuit, wherein the feedback path ensures that the synchronization circuit causes the synchronized and concurrent increasing of the voltage levels on the wordline and the voltage supply line for the row when the wordline driver has switched the voltage level on the wordline to the first positive voltage level.

14. The structure of claim 13,
wherein the wordline driver comprises: a first p-type field effect transistor and a first n-type field effect transistor connected in series between the positive voltage rail and a ground rail with the wordline driver output node being at a junction between the first p-type field effect transistor and the first n-type field effect transistor,
wherein the coupling capacitor driver comprises: a second p-type field effect transistor and a second n-type field effect transistor connected in series between the positive voltage rail and the ground rail with the coupling capacitor driver output node being at a junction between the second p-type field effect transistor and the second n-type field effect transistor, and
wherein the header switch comprises a third p-type field effect transistor.

15. The structure of claim 14, wherein the synchronization circuit comprises:
a first inverter that receives an inverted read clock signal and outputs a read clock signal, wherein the inverted read clock signal is row-specific;
a second inverter that receives the read clock signal and outputs a first wordline driver control signal, wherein the first wordline driver control signal is applied to a gate of the first n-type field effect transistor of the wordline driver;
an AND gate that receives the read clock signal and a feedback signal transmitted along the feedback path from the wordline driver output node and outputs a synchronization control signal;
an OR gate that receives the inverted read clock signal and the synchronization control signal and outputs a second wordline driver control signal, wherein the second wordline driver control signal is applied to a gate of the first p-type field effect transistor of the wordline driver; and
a NAND gate that receives the synchronization control signal and the second wordline driver control signal and outputs a coupling capacitor driver control signal, wherein the coupling capacitor driver control signal is applied to gates of the second p-type field effect transistor and the second n-type field effect transistor of the coupling capacitor driver, and wherein the read clock signal is further applied to a gate of the third p-type field effect transistor of the header switch.

16. A method comprising:
providing a memory circuit comprising: memory cells arranged in rows and columns; wordlines for the rows, wherein each wordline for each row is connected to all of the memory cells in the row; and voltage supply lines for the rows, wherein each voltage supply line for each row is connected to all of the memory cells in the row; and boost circuits for the rows, wherein each boost circuit for each row is connected to the wordline for the row and to the voltage supply line for the row and comprises: two coupling capacitors connected in series between the wordline and the voltage supply line for the row; and a coupling capacitor driver with a coupling capacitor driver output node connected to an intermediate node between the two coupling capacitors; and
increasing, by a boost circuit for a row, voltage levels on the wordline and the voltage supply line for the row.

17. The method of claim 16, wherein the increasing of the voltage levels on the wordline and the voltage supply line for the row is synchronized and concurrent.

18. The method of claim 16, wherein the increasing of the voltage levels on the wordline and the voltage supply line for the row is performed during a read operation in order to boost read current.

19. The method of claim 18, wherein, by boosting the read current during the read operation, the method reduces a probability of a read fail.

20. The method of claim 16,
wherein the memory circuit further comprises a positive voltage rail at a first positive voltage level,
wherein each boost circuit for each row is connected to the positive voltage rail,
wherein the method further comprises performing a read operation to read a stored data value in a memory cell in the row, and
wherein the performing of the read operation comprises: increasing, by the boost circuit for the row upon initiation of the read operation, a voltage level on the wordline for the row from ground to the first positive voltage level; and the increasing of the voltage levels on the wordline and the voltage supply line for the row, when the voltage level on the wordline for the row reaches the first positive voltage level such that the voltage levels on both the wordline and the voltage supply line for the row are increased from the first positive voltage level to a second positive voltage level that is greater than the first positive voltage level.

* * * * *